United States Patent [19]

Ulrich et al.

[11] 4,260,425
[45] Apr. 7, 1981

[54] PHOSPHORUS REMOVAL FROM SURFACE REGIONS OF PHOSPHOSILICATE GLASS MICROCIRCUIT LAYERS

[75] Inventors: Ralph P. Ulrich; Deborah W. Hewitt, both of Beaverton, Oreg.

[73] Assignee: Tektronix, Inc., Beaverton, Oreg.

[21] Appl. No.: 26,845

[22] Filed: Apr. 4, 1979

[51] Int. Cl.$^3$ .............................................. B05D 3/04
[52] U.S. Cl. ........................................ 134/2; 134/30; 427/344; 427/353
[58] Field of Search ...................... 134/2, 30; 427/344, 427/353; 65/30 R

[56] References Cited

U.S. PATENT DOCUMENTS

| | | | |
|---|---|---|---|
| 3,709,749 | 1/1973 | Sato et al. | 134/2 X |
| 3,940,511 | 2/1976 | Deal et al. | 427/353 X |
| 4,010,042 | 3/1977 | Boyer | 134/2 |
| 4,023,951 | 5/1977 | Shaw et al. | 65/30 R |
| 4,079,522 | 3/1978 | Ham | 134/30 X |
| 4,105,427 | 8/1978 | Elmer | 65/30 R |
| 4,139,660 | 2/1979 | Tur | 427/353 |

*Primary Examiner*—Marc L. Caroff
*Attorney, Agent, or Firm*—John D. Winkelman

[57] ABSTRACT

A method for reducing the phosphorus concentration in exposed surface areas of a phosphosilicate glass microcircuit layer to reduce the corrosivity of the layer. The method comprises a two step treatment of the layer surface: first, exposing the surface to water vapor at an elevated temperature for a time sufficient to hydrate available phosphorus in a region adjoining the surface, and second, removing the resultant acidic hydration products by rinsing the surface with water.

13 Claims, No Drawings

PHOSPHORUS REMOVAL FROM SURFACE REGIONS OF PHOSPHOSILICATE GLASS MICROCIRCUIT LAYERS

BACKGROUND AND OBJECTS OF THE INVENTION

The present invention relates generally to electrical microcircuit structures incorporating insulating or passivating layers of phosphosilicate glass. More particularly, the invention concerns a method for reducing the corrosive effect of such layers on circuit metallization.

Slica-based glasses are widely used in the manufacture of monolithic microcircuits, both to passivate the surfaces of semiconductor substrates and to provide insulation for thin-film components and metallization layers. Various techniques are used to deposit the glasses. For example, semiconductor circuits commonly are passivated by chemical vapor deposition (CVD) of a glassy material, a method that permits high-temperature glasses to be deposited at relatively low temperatures. Another frequently used method is based on the application of a siliceous material in solution form, followed by a heat exposure to provide a hardened glassy layer. The solution can be applied by spraying or dipping, but spinning is the usual method, the resulting films thus being referred to as "spun-on-glass" (SOG). Conformal coatings of controlled composition may be produced by fusing finely ground glass particles at or slightly below the glass' softening point. The fusion flows the glass, forming an adherent bond to the underlying circuit substrate.

Phosphorus is often added to the silica glasses used in microcircuit applications. The additive functions to reduce intrinsic stresses in the deposited layers and thereby prevent crack formation, to act as a getter for alkaline ions, or (in somewhat higher concentrations) to serve as a diffusion source. Despite these benefits, the presence of phosphorus in microcircuit passivation layers has been found to promote corrosion of adjoining aluminum metallization. It is known that phosphorus-doped silica glass layers absorb moisture in an amount proportional to the $P_2O_5$ content of the glass. Phosphorus oxides readily react with water, forming strong acids that will attack exposed metals.

Previous efforts to eliminate the corrosion potential of phosphosilicate glass layers have been directed at preventing moisture from coming into contact with them. One such method is to package the entire microcircuit in a hermetically sealed enclosure. Another is to cap the phosphosilicate glass with a moisture impermeable layer, typically a phosphorus-free glass. Although such procedures are effective, they share the disadvantage of being relatively high cost solutions to the problem.

A primary object of the present invention thus is to provide a way to eliminate the corrosion potential of phosphosilicate glass layers in an economical and effective manner.

Another, more specific object of the invention is to provide a method for reducing the phosphorus concentration in exposed surface regions of a phosphosilicate glass layer thereby to reduce the corrosion potential of the layer.

A further, still more specific object of the invention is to reduce the phosphorus concentration in exposed surface areas of a phosphosilicate glass layer by exposing those areas to a humid atmosphere for a time sufficient to hydrate a substantial portion of the available phosphorus in a region adjoining the surface, then removing the resultant acidic hydration products by rinsing the surface with water.

DESCRIPTION OF THE INVENTION

The present invention is based not on preventing moisture from coming into contact with a phosphosilicate glass layer as taught by the prior art, but rather on selectively depleting the layer of available phosphorus in exposed surface areas by intentionally exposing it to moisture. The moisture reacts with the phosphorus at the layer surface, forming acidic products that are subsequently washed away.

In accordance with the best mode presently contemplated for practicing the invention, a microcircuit that includes a phosphosilicate glass layer having uncovered surface areas is exposed to water vapor at an elevated temperature for a time sufficient to hydrate at least a portion of the available phosphorus in the uncovered areas and form aqueous acid reaction products at the layer surface. The reaction products then are removed by rinsing the surface with water. Preferred practice is to expose the glass layer to water vapor in the form of steam at substantially atmospheric pressure. A thirty minute exposure has been found sufficient to hydrate substantially all of the available phosphorus in a thin region adjacent the surface of a SOG layer initially containing about 8–11% $P_2O_5$ throughout. Following the steam exposure, the acidic reaction products are rinsed away with deionized water.

As used herein, the term "available phosphorus" refers to that portion of the total phosphorus present in a phosphorus-containing glass layer which is capable of being removed by treating exposed surface areas of the layer using the water vapor/water rinse treatment of the invention. The conditions (water vapor temperature, exposure time, etc.) needed to achieve substantially complete removal of the available phosphorus from a deposited layer can be determined empirically without undue experimentation in the following manner: After treating a phosphorus-containing silica glass layer to remove available phosphorus from a region adjoining the exposed surface of the layer, an aluminum metallization pattern is deposited on the treated surface. The pattern suitably includes unconnected elements (runs, pads, etc.) that are spaced apart on the order of 0.001 inches. The wafer or other substrate bearing the treated layer is then placed in a chamber maintained at 85° C. and 85% relative humidity, with a bias potential of about 20 V.D.C. applied to the unconnected elements of the metallization pattern. Periodic inspections are made for the presence of corrosion, which can be detected visually. It has been found that untreated SOG layers containing in the range of about 8–11% $P_2O_5$ will produce visible corrosion in less than 24 hours under these conditions. Test specimens treated to remove phosphorus from the layer in the manner described above (30 minute steam exposure with deionized water rinse) have survived more than 3,000 hours without evidence of attack on the metallization.

An important and significant aspect of the invention is that available phosphorus is not removed from the entire thickness of the glass layer, but only from a thin zone or region adjoining the treated surface. As a result, beneficial properties produced by the phosphorus, such as stress reduction, are not negated by the corrosion-preventing treatment. It may be noted that the treatment method of the invention is useful when the circuit metallization is disposed beneath a phosphosilicate layer (e.g., in a multilayer metal structure where the glass serves as interlayer insulation) as well as when the metal is disposed atop a phosphorus-containing layer. In the first-mentioned instance, the treatment method minimizes the potential for corrosion at interlayer openings, or vias, in the glass. Where a microcircuit structure includes multiple phosphosilicate glass layers, the treatment method may be performed after the deposition of each such layer.

A phosphorus-removal method has been described that amply fulfills the various objectives set forth above. While the best mode presently contemplated for practicing the invention has been described in detail, it will be appreciated that various changes or modifications will be apparant to those skilled in the relevant. The appended claims are thus intended to cover all such variations as come within the lawful scope of the invention.

We claim as our invention:

1. A method for treating a phosphorus-containing silicon oxide glass layer to render uncovered surface regions thereof substantially noncorrosive to metal, comprising the steps of:
   exposing said uncovered regions of the glass layer to a humid atmosphere for a time sufficient to hydrate substantially all of the available phosphorus within said regions, and
   removing resultant acidic hydration products by rinsing said surface regions with water.

2. The method of claim 1, wherein said humid atmosphere is in the form of steam.

3. The method of claim 2, wherein said regions are exposed to steam at substantially atmospheric pressure.

4. A method for treating a phosphorus-containing silicon oxide glass layer to reduce the phosphorus concentration in selected surface regions of said layer, comprising the steps of:
   exposing the selected regions to a humid atmosphere for a time and at a temperature sufficient to hydrate at least a portion of available phosphorus within said regions and form aqueous reaction products on the layer's surface, and
   removing the reaction products by rinsing the surface with water.

5. The method of claim 4, wherein said humid atmosphere consists essentially of steam.

6. The method of claim 4, wherein said exposing step is performed at a temperature and for a time sufficient to substantially deplete the layer of available phosphorus in said regions.

7. In the manufacture of an electrical microcircuit structure that includes a phosphosilicate glass layer, the improvement wherein the phosphorus concentration in uncovered surface regions of the layer is reduced to render said regions less corrosive to metal, said reduction being achieved by a method comprising the steps of:
   exposing said regions to water vapor for a time sufficient to hydrate a portion of the available phosphorus within said regions and form aqueous acidic reaction products on the surface thereof, and
   removing said reaction products by subjecting said regions to a water rinse.

8. The method of claim 7, wherein said regions are exposed to water vapor for a time sufficient to substantially deplete the layer of available phosphorus within said regions.

9. The method of claim 7, wherein said water vapor is in the form of steam.

10. The method of claim 9, wherein said regions are exposed to steam at substantially atmospheric pressure.

11. The method of claim 10, wherein said regions are exposed to said steam atmosphere for a period of about 30 minutes.

12. In the manufacture of an electrical microcircuit structure that includes a phosphosilicate glass layer, the improvement wherein uncovered surface regions of said layer are exposed to steam for a time sufficient to hydrate a substantial portion of the available phosphorus in said regions and form aqueous acidic reaction products at the surface thereof, and wherein said reaction products are subsequently removed by subjecting said regions to a water rinse.

13. The improvement of claim 12, wherein said steam exposure is at substantially atmospheric pressure.

* * * * *